(12) United States Patent
Homma et al.

(10) Patent No.: US 10,349,792 B2
(45) Date of Patent: Jul. 16, 2019

(54) HAND DRYING APPARATUS

(71) Applicant: Mitsubishi Electric Corporation, Chiyoda-ku, Tokyo (JP)

(72) Inventors: Koichiro Homma, Tokyo (JP); Ryoji Mori, Tokyo (JP); Ryota Murai, Tokyo (JP); Tatsuya Fujimura, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 364 days.

(21) Appl. No.: 15/116,407

(22) PCT Filed: Feb. 27, 2014

(86) PCT No.: PCT/JP2014/054861
§ 371 (c)(1),
(2) Date: Aug. 3, 2016

(87) PCT Pub. No.: WO2015/128989
PCT Pub. Date: Sep. 3, 2015

(65) Prior Publication Data
US 2017/0007081 A1 Jan. 12, 2017

(51) Int. Cl.
*F26B 19/00* (2006.01)
*A47K 10/48* (2006.01)
*H03K 17/96* (2006.01)

(52) U.S. Cl.
CPC ......... *A47K 10/48* (2013.01); *H03K 17/9622* (2013.01); *H03K 2217/96058* (2013.01); *H03K 2217/960705* (2013.01)

(58) Field of Classification Search
CPC .............. A47K 10/48; H03K 17/9622; H03K 17/960705; H03K 17/96058
(Continued)

(56) References Cited

U.S. PATENT DOCUMENTS 6,320,282 B1 11/2001 Caldwell
6,713,897 B2 3/2004 Caldwell
(Continued)

FOREIGN PATENT DOCUMENTS

CN 2528043 Y 12/2002
CN 103425370 A * 12/2013 .............. G01D 5/24
(Continued)

OTHER PUBLICATIONS

Office Action (Communication pursuant to Article 94(3) EPC) dated Mar. 19, 2018, by the European Patent Office in corresponding European Patent Application No. 14884047.3. (4 pages).
(Continued)

*Primary Examiner* — John P McCormack
(74) *Attorney, Agent, or Firm* — Buchanan Ingersoll & Rooney PC

(57) ABSTRACT

A hand dryer that includes a capacitance-detection-type proximity sensor structure that detects a capacitance generated in a capacitance detection electrode to detect a presence or absence of an object to be detected, includes a plurality of capacitance-detection-type proximity sensor structures. While one of the capacitance-detection-type proximity sensor structures is in operation, an operation of at least another of the capacitance-detection-type proximity sensor structures is stopped to operate the capacitance-detection-type proximity sensor structures during different periods of time.

9 Claims, 5 Drawing Sheets

(58) Field of Classification Search
USPC .................................. 34/528, 524, 626, 531
See application file for complete search history.

(56) References Cited

U.S. PATENT DOCUMENTS

| | | | |
|---|---|---|---|
| 6,897,390 | B2 | 5/2005 | Caldwell et al. |
| 7,030,513 | B2 | 4/2006 | Caldwell |
| 7,098,414 | B2 | 8/2006 | Caldwell |
| 7,218,498 | B2 | 5/2007 | Caldwell |
| 7,242,393 | B2 | 7/2007 | Caldwell |
| 7,260,438 | B2 | 8/2007 | Caldwell et al. |
| 7,361,860 | B2 | 4/2008 | Caldwell |
| 7,532,131 | B2 | 5/2009 | Schaefer et al. |
| 7,545,153 | B2 | 6/2009 | Abe |
| 7,840,286 | B2 | 11/2010 | Caldwell et al. |
| 7,856,736 | B2 | 12/2010 | Churchill et al. |
| RE42,199 | E | 3/2011 | Caldwell |
| 7,906,875 | B2 | 3/2011 | Caldwell et al. |
| 7,971,368 | B2 | 7/2011 | Fukaya et al. |
| 8,135,482 | B2 | 3/2012 | Caldwell et al. |
| 8,227,940 | B2 | 7/2012 | Caldwell et al. |
| 8,307,549 | B2 | 11/2012 | Caldwell et al. |
| 8,739,430 | B2 | 6/2014 | Fukaya et al. |
| 9,306,561 | B2 | 4/2016 | Caldwell et al. |
| 9,317,164 | B2 | 4/2016 | Suwald |
| 2006/0145539 | A1* | 7/2006 | Muller ............... H03K 17/9622 307/116 |
| 2010/0154239 | A1* | 6/2010 | Hutchinson ............ A47K 10/48 34/82 |
| 2010/0218978 | A1 | 9/2010 | Caldwell et al. |

FOREIGN PATENT DOCUMENTS

| | | |
|---|---|---|
| JP | 64-75730 A | 3/1989 |
| JP | 04-203714 A | 7/1992 |
| JP | 2001-004166 A | 1/2001 |
| JP | 2001-159684 A | 6/2001 |
| JP | 2001-327433 A | 11/2001 |
| JP | 2002-034853 A | 2/2002 |
| JP | 2004-154288 A | 6/2004 |
| JP | 2004-313219 A | 11/2004 |
| JP | 2006-097924 A | 4/2006 |
| JP | 2008-008831 A | 1/2008 |
| JP | 2008-192336 A | 8/2008 |
| JP | 2009-074541 A | 4/2009 |
| JP | 2010-193492 A | 9/2010 |
| JP | 2010-220925 A | 10/2010 |
| JP | 4578980 B2 | 11/2010 |
| JP | 4714817 B2 | 6/2011 |
| JP | 2013-99396 A | 5/2013 |
| JP | 2013-101011 A | 5/2013 |
| JP | 2015-27347 A | 2/2015 |
| TW | 200704387 A | 2/2007 |
| TW | 200744515 A | 12/2007 |
| TW | 200944169 A | 11/2009 |
| TW | 201222359 A1 | 6/2012 |
| TW | M461864 U1 | 9/2013 |

OTHER PUBLICATIONS

Office Action dated Feb. 5, 2018, by the Chinese Patent Office in corresponding Chinese Patent Application No. 201480076326.0 and English translation of the Office Action. (13 pages).

Office Action dated Feb. 5, 2018, by the Chinese Patent Office in corresponding Chinese Patent Application No. 201480075306.1 and English translation of the Office Action. (12 pages).

Office Action (Notification of Reasons for Refusal) dated Oct. 3, 2017, by the Japanese Patent Office in corresponding Japanese Patent Application No. 2016-504932 and English translation of the Office Action. (5 pages).

Extended European Search Report dated Sep. 29, 2017, issued by the European Patent Office in corresponding European Application No. 14883986.3. (8 pages).

Extended European Search Report dated Jul. 5, 2017, issued by the European Patent Office in corresponding European Application No. 14884047.3. (7 pages).

Office Action dated Jan. 19, 2018, by the Chinese Patent Office in corresponding Chinese Patent Application No. 201480074693.7 and English translation of the Office Action. (13 pages).

Office Action (Notice of Rejection) dated Feb. 21, 2017, by the Japanese Patent Office in corresponding Japanese Patent Application No. 2016-504931 and partial English translation of the Office Action. (8 pages).

Office Action (Notice of Rejection) dated Feb. 28, 2017, by the Japanese Patent Office in corresponding Japanese Patent Application No. 2016-504932 and partial English translation of the Office Action. (6 pages).

International Search Report (PCT/ISA/210) dated May 27, 2014, by the Japanese Patent Office as the International Searching Authority for International Application No. PCT/JP2014/054861.

Written Opinion (PCT/ISA/237) dated May 27, 2014, by the Japanese Patent Office as the International Searching Authority for International Application No. PCT/JP2014/054861.

Notice of Rejection, corresponding to PCT/JP2014/054859, dated Dec. 15, 2015 in Taiwanese Application No. 103131107, with English translation.

Notice of Rejection, corresponding to PCT/JP2014/054860, dated Dec. 15, 2015 in Taiwanese Application No. 103131108, with English translation.

Notice of Rejection, corresponding to PCT/JP2014/054861, dated Dec. 23, 2015 in Taiwanese Application No. 103131109, with English translation.

Notice of Rejection, corresponding to PCT/JP2014/054863, dated Dec. 14, 2015 in Taiwanese Application No. 103131110, with English translation.

Notice of Rejection, corresponding to PCT/JP 2014/054862, dated Dec. 18, 2015 in Taiwanese Application No. 103131111, with English translation.

* cited by examiner

HAND DRYING APPARATUS

FIELD

The present invention relates to a hand drying apparatus that uses a proximity sensor that detects the approach of an object in accordance with a change in capacitance.

BACKGROUND

Capacitance-detection-type proximity sensors (which are also referred to as capacitance-detection-type sensors) detect the approach of objects (objects to be detected) by measuring the change in capacitance that occurs due to the presence of human bodies or the like. Capacitance-detection-type proximity sensors can be broadly classified into two types depending on where the detection electrode is disposed.

The first type uses an appropriate method to detect and measure the capacitance (i.e., earth capacitance) that one detection electrode disposed to face an open space forms relative to the common ground potential (or common reference potential). When an object to be detected approaches the detection electrode, the capacitance changes due to the effect of the object to be detected. This change is measured in order to detect the approach of the object to be detected.

The second type measures the capacitance (i.e., inter-electrode capacitance) that is formed between two detection electrodes disposed to face each other. An object to be detected that is present between the two detection electrodes changes the inter-electrode capacitance. This change is measured in order to detect the approach of the object to be detected.

The invention disclosed, for example, in Patent Literature 1 relates to a hand dryer that uses capacitance-detection-type proximity sensors. The technology disclosed in Patent Literature 1 is such that detection electrodes are disposed near the hand insertion portion in order to detect the presence or absence of a hand inserted into the hand insertion portion and the presence or absence of a hand is detected in accordance with the change in capacitance that is generated in the detection electrodes due to the hand being inserted into the hand insertion portion.

CITATION LIST

Patent Literature

Patent Literature 1: Japanese Patent Application Laid-open No. 2013-99396

SUMMARY

Technical Problem

With the invention disclosed in Patent Literature 1, however, when two or more detection electrodes disposed in the hand insertion portion operate (i.e., the detection electrodes are energized) simultaneously, the energization of one detection electrode affects the capacitance that is generated in the other detection electrode. Thus, the capacitance generated due to the insertion of a hand cannot be distinguished from the capacitance that is generated due to the energization of the other detection electrode. This poses a problem in that the hand detection accuracy decreases.

In other words, with a hand drying apparatus that includes a plurality of capacitance-detection-type proximity sensors, it is desirable to increase the detection accuracy of each of the capacitance sensors.

The present invention has been achieved in view of the above and an object of the present invention is to provide a hand drying apparatus that includes a plurality of capacitance-detection-type proximity sensors and in which each of the capacitance-detection-type proximity sensors has a high detection accuracy.

Solution to Problem

In order to solve the above problems and achieve the object, an aspect of the present invention is a hand drying apparatus that includes a capacitance-detection-type sensor that detects a capacitance generated in a capacitance detection electrode to detect a presence or absence of an object to be detected, the hand drying apparatus including a plurality of capacitance-detection-type sensors, wherein while one of the capacitance-detection-type sensors is in operation, an operation of at least another of the capacitance-detection-type sensors is stopped.

Advantageous Effects of Invention

The hand drying apparatus according to the present invention has an effect of enabling the detection accuracy of each of a plurality of capacitance-detection-type sensors to be improved.

DESCRIPTION OF EMBODIMENTS

Exemplary embodiments of a hand drying apparatus according to the present invention will be explained below in detail with reference to the drawings. This invention is not limited to the embodiments.

First Embodiment

Figure 1:
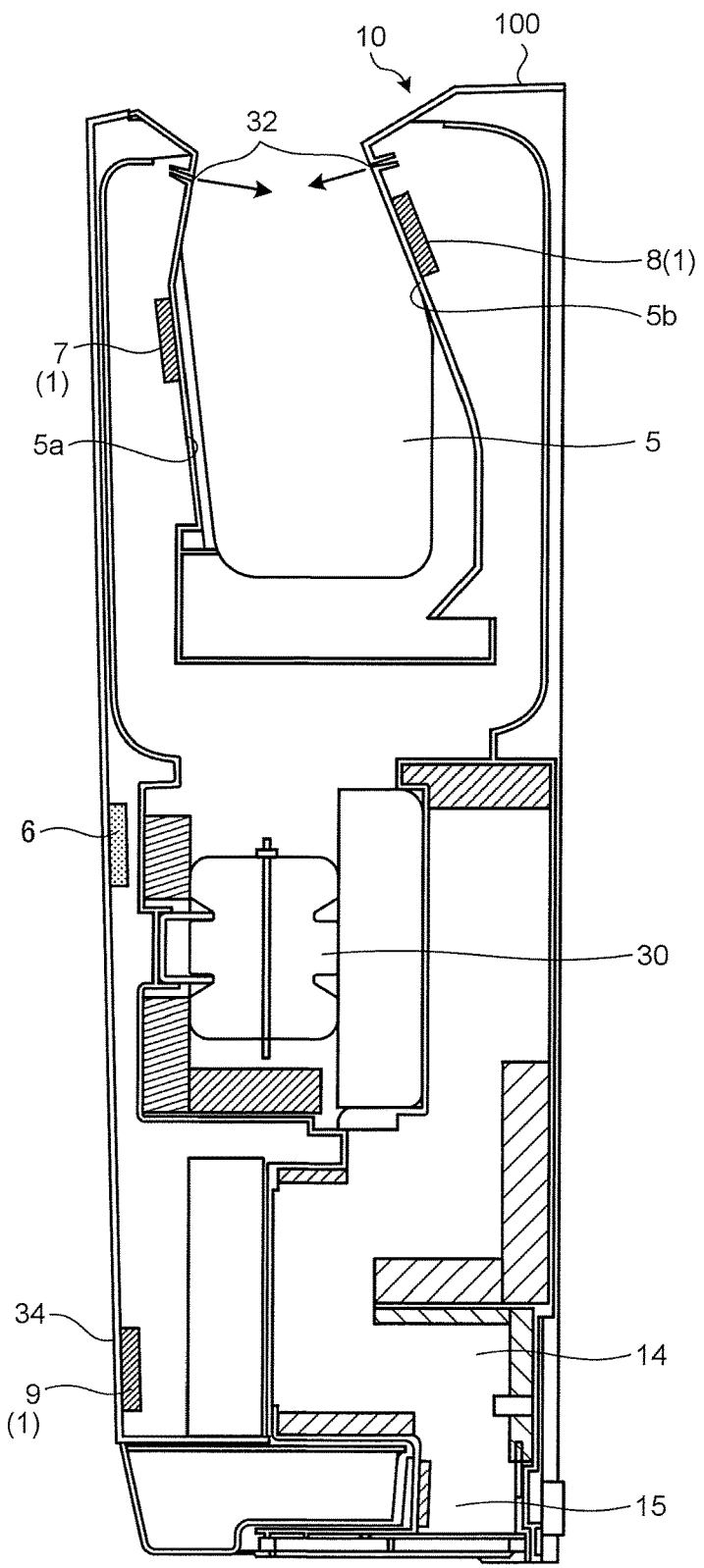
FIG. 1 is a cross-sectional view of a hand dryer according to a first embodiment of a hand drying apparatus according to the present invention.

FIG. 1 is a cross-sectional view of a hand dryer according to a first embodiment of a hand drying apparatus according to the present invention. A hand dryer 10 includes a housing 100 that forms the outer surface and that is provided with a hand insertion portion 5 that is open-topped and open-sided to enable a hand to be inserted from the outside. Nozzles 32 are provided on the opening side of the upper portion of the hand insertion portion 5. The air is blown from the nozzles 32 toward the hand insertion portion 5.

The housing 100 is provided therein with an airflow generating device 30 and a control unit 6 that controls, for example, the operations of the airflow generating device 30. The airflow generating device 30 draws the external air from an air inlet 15 provided in the lower portion of the housing 100 along an airflow path 14 in the housing 100 to generate airflow and blows the air from the nozzles 32.

In the housing 100, two capacitance-detection-type proximity sensor structures 1, which will be described later, are disposed as sensors for detecting the insertion of a hand into the hand insertion portion 5 on the mutually facing wall surfaces that form the front and rear walls of the hand insertion portion 5 among the surfaces that constitute the hand insertion portion 5. Specifically, a front-side capacitance-detection-type proximity sensor structure for hand detection 7 is disposed on a front wall 5a, which is a wall surface on the near side of the body, and a rear-side capacitance-detection-type proximity sensor structure for hand detection 8 is disposed on a rear wall 5b, which is a wall surface on the rear side of the body. An operation unit 34 is provided in the lower portion on the front surface side of the housing 100. In the housing 100, the capacitance-detection-type proximity sensor structure 1 that is a capacitance-detection-type proximity sensor structure for detecting a switching operation 9 is disposed near or on the operation unit 34.

The capacitance-detection-type proximity sensor structure for detecting a switching operation 9 detects whether the operation unit 34 is touched by a hand and is operated in accordance with the capacitance generated in the capacitance-detection-type proximity sensor structure for detecting a switching operation 9. The capacitance-detection-type proximity sensor structure for detecting a switching operation 9 switches the power of the airflow generating device 30 on and off (i.e., starts and stops the operation of the airflow generating device 30). A plurality of the capacitance-detection-type proximity sensor structures 1 may be disposed near or on the operation unit 34 and may each have a function of changing the volume of the airflow generated by the airflow generating device 30 or a function of switching the heater (not illustrated) for heating the air on and off before the air is blown from the nozzles 32.

Figure 2:
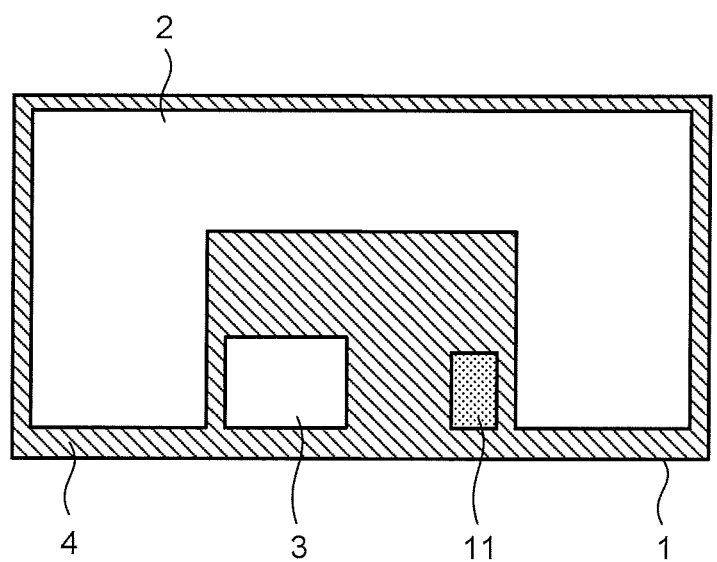
FIG. 2 is a schematic diagram of a capacitance-detection-type proximity sensor structure.

FIG. 2 is a schematic diagram of a capacitance-detection-type proximity sensor structure. The capacitance-detection-type proximity sensor structure 1 is a structure that constitutes a capacitance-detection-type proximity sensor (capacitance-detection-type sensor). The capacitance-detection-type proximity sensor structure 1 includes a detection electrode 2 serving as an electrode for detecting the capacitance and a control element 3 that processes the detected capacitance and determines the presence or absence of an object to be detected. The detection electrode 2 and the control element 3 are mounted on the same printed board 4. A connector 11 to which a cable for communication with the control unit 6 is connected is mounted on the printed board 4.

As illustrated in FIG. 1, when the capacitance-detection-type proximity sensor structures 1 that are independent from each other and serve as the front-side capacitance-detection-type proximity sensor structure for hand detection 7 and the rear-side capacitance-detection-type proximity sensor structure for hand detection 8 are respectively disposed within the planes of the front wall 5a and the rear wall 5b, which constitute the hand insertion portion 5, and the capacitance-detection-type proximity sensor structures 1 are operated simultaneously to detect the capacitances in the hand insertion portion 5, the capacitances are affected by each other and thus a hand cannot be detected accurately. Therefore, the control unit 6 performs a control such that the capacitance-detection-type proximity sensor structures 1 having an overlapping detectable range do not operate simultaneously.

The control unit 6 controls the operations of the front-side capacitance-detection-type proximity sensor structure for hand detection 7, the rear-side capacitance-detection-type proximity sensor structure for hand detection 8, and the capacitance-detection-type proximity sensor structure for detecting a switching operation 9. In other words, the control unit 6 controls, for example, which of the capacitance-detection-type proximity sensor structures 1 is to operate or be stopped and the timing at which the capacitance-detection-type proximity sensor structures 1 are operated or stopped.

Figure 3:
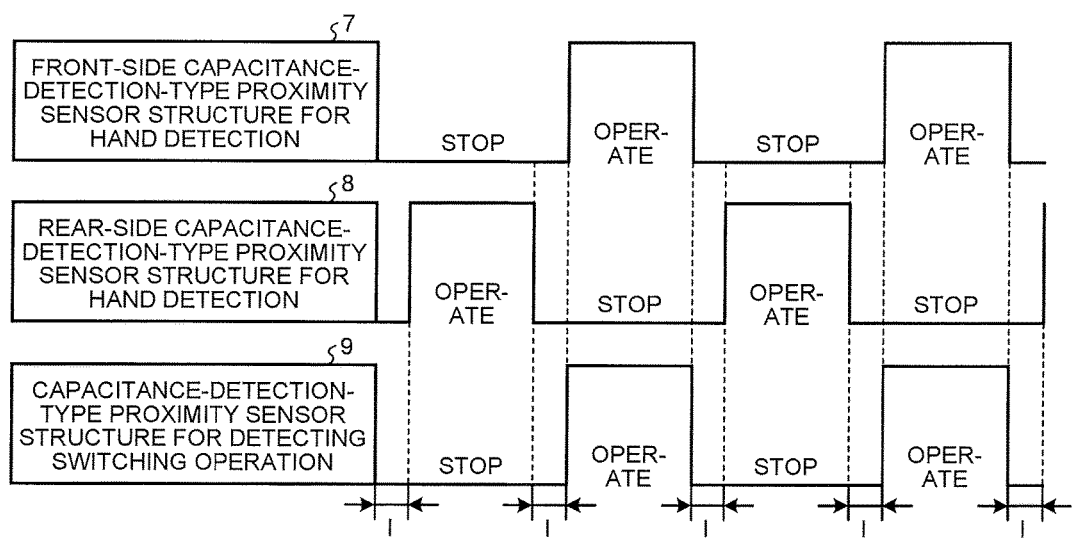
FIG. 3 is a diagram schematically illustrating the timing at which the operations of a front-side capacitance-detection-type proximity sensor structure for hand detection, a rear-side capacitance-detection-type proximity sensor structure for hand detection, and a capacitance-detection-type proximity sensor structure for detecting a switching operation are controlled.

FIG. 3 is a diagram schematically illustrating the timing at which the operations of the front-side capacitance-detection-type proximity sensor structure for hand detection, the rear-side capacitance-detection-type proximity sensor structure for hand detection, and the capacitance-detection-type proximity sensor structure for detecting a switching operation are controlled. The front-side capacitance-detection-type proximity sensor structure for hand detection 7 and the rear-side capacitance-detection-type proximity sensor structure for hand detection 8 respectively disposed on the front wall 5a and the rear wall 5b, which constitute the hand insertion portion 5, are controlled in such a way as to operate at different timings so that they do not operate simultaneously. To that end, the detection electrodes 2 of the front-side capacitance-detection-type proximity sensor structure for hand detection 7 and the rear-side capacitance-detection-type proximity sensor structure for hand detection 8 are energized at different timings so that they are not energized simultaneously. Accordingly, the capacitance generated in one of the detection electrodes 2 due to the insertion of a hand into the hand insertion portion 5 does not include the capacitance generated by energizing the other of the detection electrodes 2 (capacitance is not generated in one of the detection electrodes 2 by energizing the other of the detection electrodes 2); therefore, a hand inserted into the hand insertion portion 5 can be detected with high accuracy. Moreover, the capacitance-detection-type proximity sensor structures 1 serving as the front-side capacitance-detection-type proximity sensor structure for hand detection 7 and the rear-side capacitance-detection-type proximity sensor structure for hand detection 8 are respectively disposed on the front wall 5a and the rear wall 5b, which face each other, of the hand insertion portion 5; therefore, the hand detection range in the hand insertion portion 5 can be increased. In particular, a hand can be detected even when it is inserted more to the front or the rear.

Furthermore, the front-side capacitance-detection-type proximity sensor structure for hand detection 7 or the rear-side capacitance-detection-type proximity sensor structure for hand detection 8 is disposed at a sufficient distance from the capacitance-detection-type proximity sensor structure for detecting a switching operation 9; therefore, even when the detection electrode 2 of the front-side capacitance-detection-type proximity sensor structure for hand detection 7 or the rear-side capacitance-detection-type proximity sensor structure for hand detection 8 is energized and the detection electrode 2 of the capacitance-detection-type proximity sensor structure for detecting a switching operation 9 is energized, the capacitances generated in the respective detection electrodes 2 are not significantly affected by each other (capacitance is hardly generated in one of the detection electrodes 2 by energizing the other of the detection electrodes 2). Thus, the detection electrode 2 of the front-side capacitance-detection-type proximity sensor structure for hand detection 7 and the detection electrode 2 of the capacitance-detection-type proximity sensor structure for detecting a switching operation 9 are energized at the same timing. Therefore, when the detection electrode 2 of the front-side capacitance-detection-type proximity sensor structure for hand detection 7 and the detection electrode 2 of the capacitance-detection-type proximity sensor structure for detecting a switching operation 9 are energized, the period of time during which a hand is not detected can be shortened as much as possible.

Moreover, when the operation of each of the capacitance-detection-type proximity sensor structures 1 is switched, i.e., when the energization of the detection electrode 2 is switched, a period of non-operation (a non-energized period during which no detection electrode 2 is energized) I is provided during which no capacitance-detection-type proximity sensor structure 1 is operated. With the provision of the period of non-operation (non-energized period) I, the charge still remaining in one of the detection electrodes 2 immediately after the one of the detection electrodes 2 is de-energized is reduced, and then, the other of the detection electrodes 2 is energized to detect the capacitance thereof. Therefore, a hand inserted into the hand insertion portion 5 can be detected with high accuracy without being affected by the charge in the other detection electrode.

The above description exemplifies the case where the detection electrode 2 of the front-side capacitance-detection-type proximity sensor structure for hand detection 7 and the detection electrode 2 of the capacitance-detection-type proximity sensor structure for detecting a switching operation 9 are energized at the same timing; however, instead of the front-side capacitance-detection-type proximity sensor structure for hand detection 7, the detection electrode 2 of the rear-side capacitance-detection-type proximity sensor structure for hand detection 8 and the detection electrode 2 of the capacitance-detection-type proximity sensor structure for detecting a switching operation 9 may be energized at the same timing. Energizing all of the front-side capacitance-detection-type proximity sensor structure for hand detection 7, the rear-side capacitance-detection-type proximity sensor structure for hand detection 8, and the capacitance-detection-type proximity sensor structure for detecting a switching operation 9 during different periods of time enables the hand detection accuracy to be further increased.

Moreover, in the first embodiment, a case is exemplified where two capacitance-detection-type proximity sensor structures 1 are disposed for detecting a hand and one capacitance-detection-type proximity sensor structure 1 is disposed for detecting a switching operation; however, it is satisfactory if the number of the capacitance-detection-type proximity sensor structures 1 to be used is appropriately changed in accordance with the required hand detection range. For example, two capacitance-detection-type proximity sensor structures for hand detection may be provided on each of the near side and the far side and two capacitance-detection-type proximity sensor structures for detecting a switching operation may be provided.

Moreover, in the first embodiment, a case is exemplified where, as illustrated in FIG. 2, the detection electrode 2 and the control element 3 are disposed on the same printed board; however, the control element 3 and the detection electrode 2 may be mounted in different locations.

Furthermore, in the first embodiment, the detection electrode 2 is a copper foil printed on a printed board; however, the detection electrode 2 is not limited to copper foil and any conductive member other than a copper foil may be used for the detection electrode 2. For example, a conductive wire, a conductive metal plate, a conductive metal tape, a conductive metal sheet, or the like may be used for the detection electrode 2.

Moreover, in the first embodiment, a case is exemplified where the detection electrode 2 and the control element 3 are provided as a pair; however, one control element 3 may be provided for two or more detection electrodes 2 as long as the control element 3 can control the energization of each of the detection electrodes 2 independently and can detect and process the capacitance generated in each of the detection electrodes 2 independently.

Furthermore, in the first embodiment, a case is exemplified where the detection electrode 2 and the control element 3 are disposed on the same plane of the printed board; however, it is also possible to dispose the detection electrode 2 on one of the surfaces of the printed board and dispose the control element 3 on the other surface of the printed board.

Second Embodiment

Figure 4:
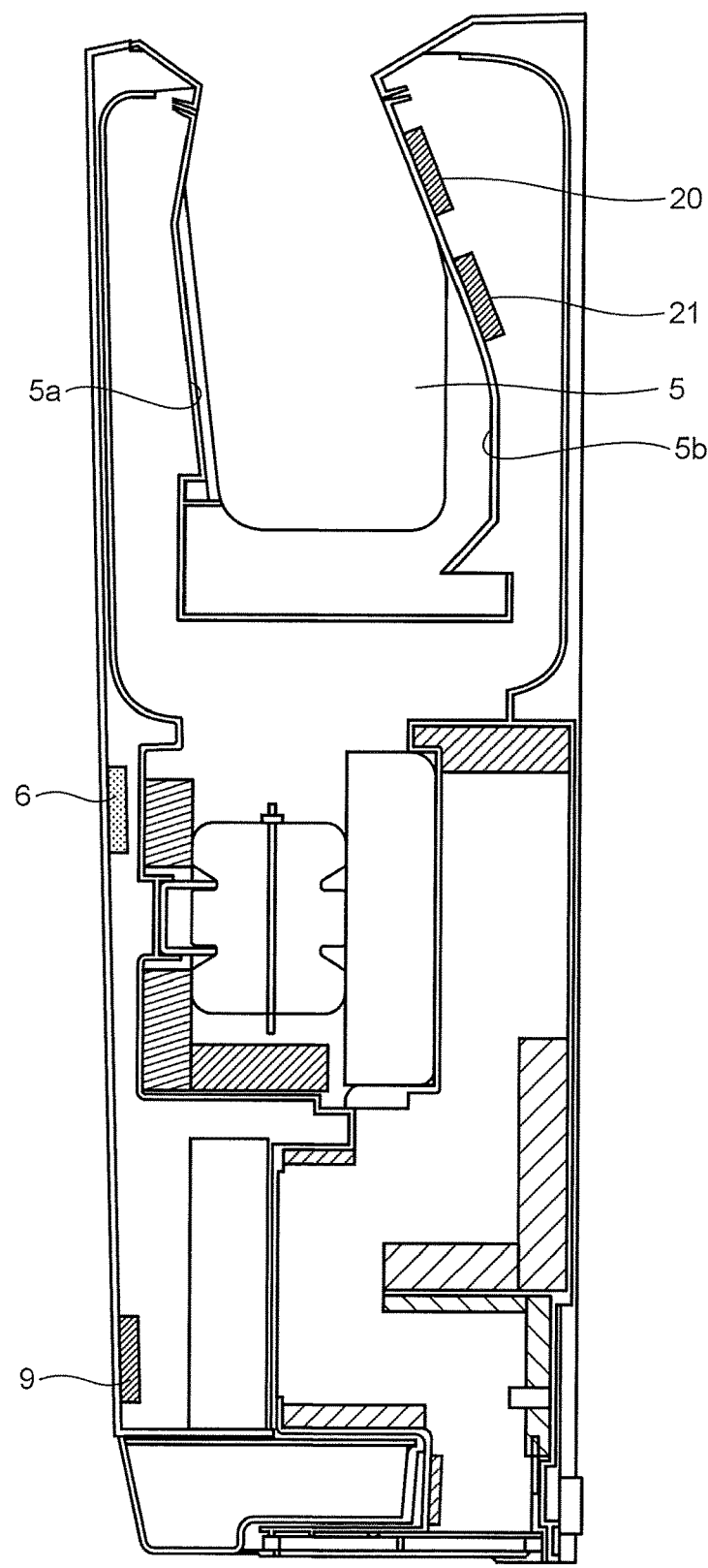
FIG. 4 is a cross-sectional view of a hand dryer according to a second embodiment of the hand drying apparatus according to the present invention.

FIG. 4 is a cross-sectional view of a hand dryer according to a second embodiment of the hand drying apparatus according to the present invention. The hand dryer according to the second embodiment is configured such that two capacitance-detection-type proximity sensor structures 1 described in the first embodiment are disposed on the rear wall 5b, which forms the surface on the rear side among the surfaces that constitute the hand insertion portion 5. Specifically, an upper-side capacitance-detection-type proximity sensor structure for hand detection 20 is provided on the upper side of the hand insertion portion 5 and a lower-side capacitance-detection-type proximity sensor structure for hand detection 21 is provided in the lower space of the hand insertion portion 5. The detection electrodes 2 of the upper-side capacitance-detection-type proximity sensor structure for hand detection 20 and the lower-side capacitance-detection-type proximity sensor structure for hand detection 21 are energized during different periods of time so that they are not energized simultaneously (i.e., they do not operate simultaneously). Other configurations and operations are similar to those in the first embodiment.

According to the second embodiment, the capacitance-detection-type proximity sensor structure 1 is provided on each of the upper side and the lower side of the hand insertion portion 5; therefore, a hand inserted into the hand insertion portion 5 can be detected with high accuracy. Specially, the hand detection range in the hand insertion portion 5 in the vertical direction can be increased and each of the upper-side capacitance-detection-type proximity sensor structure for hand detection 20 and the lower-side capacitance-detection-type proximity sensor structure for hand detection 21 independently detects the presence or absence of a hand in the hand insertion portion 5; therefore, the position in the vertical direction of a hand inserted into the hand insertion portion 5 can be detected in accordance with the detection state of the upper-side capacitance-detection-type proximity sensor structure for hand detection 20 and the lower-side capacitance-detection-type proximity sensor structure for hand detection 21. Accordingly, the airflow generating device can be started after a hand is inserted far enough into the hand insertion portion 5. Therefore, the airflow generating device can be prevented from starting before a hand is sufficiently inserted and thus water droplets can be prevented from splashing onto the face or body of the user from the user's hand.

In the second embodiment, a case is exemplified where two capacitance-detection-type proximity sensor structures 1 are provided on the rear wall 5b, which constitutes the hand insertion portion 5; however, two capacitance-detection-type proximity sensor structures 1 may be provided on the front wall 5a.

Moreover, in the second embodiment, a case is exemplified where two capacitance-detection-type proximity sensor structures 1 are provided in the vertical direction; however, if the capacitance-detection-type proximity sensor structures 1 are provided in the horizontal direction, it enables the horizontal detection range to be increased and also enables the position of a hand to be detected in the horizontal direction.

Furthermore, in the second embodiment, a case is exemplified where two capacitance-detection-type proximity sensor structures 1 are provided in the vertical direction; however, the number of the capacitance-detection-type proximity sensor structures 1 to be provided is not limited to two and three or more capacitance-detection-type proximity sensor structures 1 may be provided in order to increase the detection range and to increase hand-position detection accuracy. It is obvious that two or more capacitance-detection-type proximity sensor structures 1 may be disposed not only on one surface that constitutes the hand insertion portion 5 but also on each of a plurality of surfaces that constitute the hand insertion portion 5.

Third Embodiment

Figure 5:
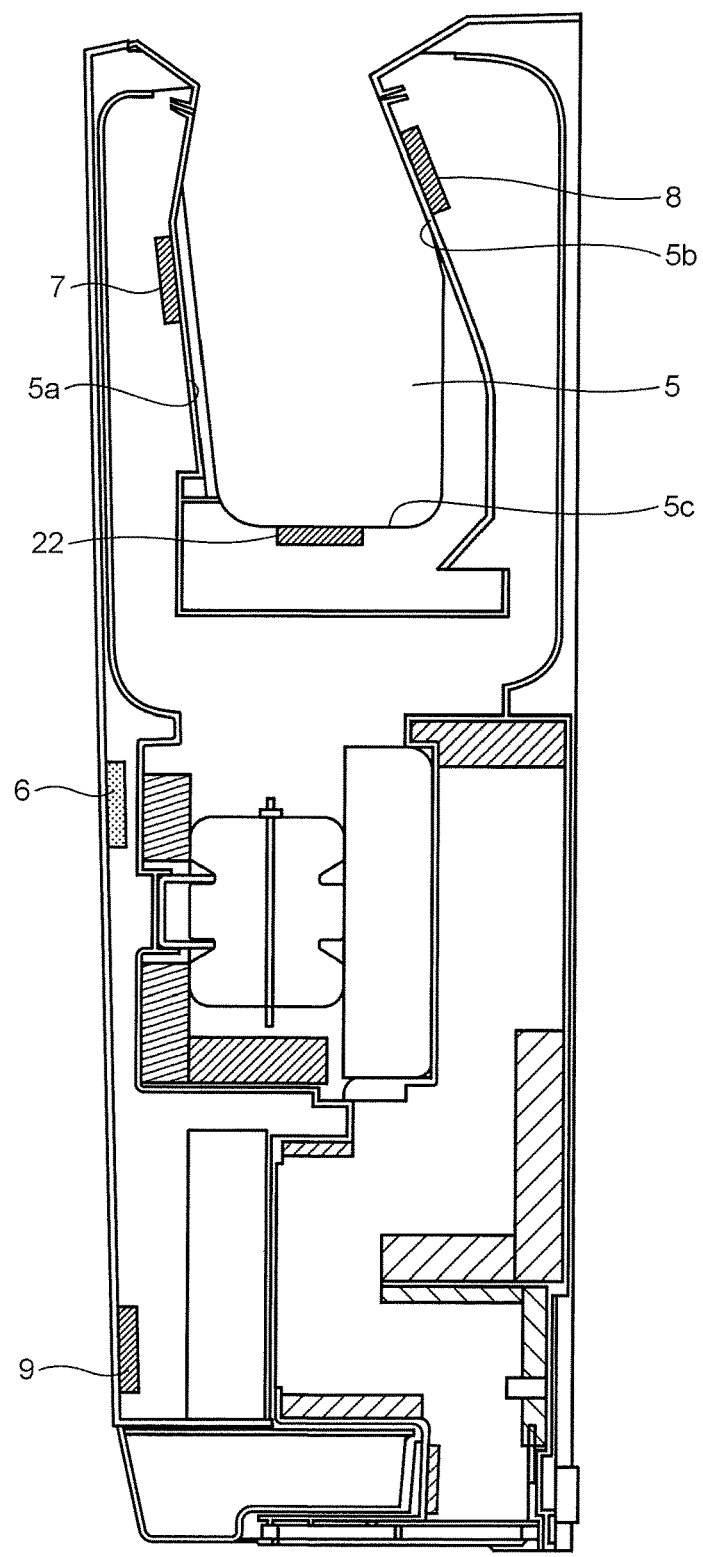
FIG. 5 is a cross-sectional view of a hand dryer according to a third embodiment of the hand drying apparatus according to the present invention.

FIG. 5 is a cross-sectional view of a hand dryer according to a third embodiment of the hand drying apparatus according to the present invention. The hand dryer according to the third embodiment is configured such that the capacitance-detection-type proximity sensor structure 1 described in the first embodiment is disposed on each of the three surfaces of the surfaces that constitute the hand insertion portion 5. Specifically, the front-side capacitance-detection-type proximity sensor structure for hand detection 7, the rear-side capacitance-detection-type proximity sensor structure for hand detection 8, and a bottom-side capacitance-detection-type proximity sensor structure for hand detection 22 are respectively disposed on the front wall 5a, the rear wall 5b, and a bottom wall 5c of the hand insertion portion 5. The detection electrodes 2 of the front-side capacitance-detection-type proximity sensor structure for hand detection 7, the rear-side capacitance-detection-type proximity sensor structure for hand detection 8, and the bottom-side capacitance-detection-type proximity sensor structure for hand detection 22 are energized during different periods of time so that they are not energized simultaneously (i.e., they do not operate simultaneously). Other configurations and operations are similar to those in the first embodiment.

According to the third embodiment, the capacitance-detection-type proximity sensor structure 1 is provided also on the bottom surface that constitutes the hand insertion portion 5. Accordingly, the airflow generating device can be started after a hand is inserted far enough into the hand insertion portion 5. Therefore, the airflow generating device can be prevented from starting before a hand is sufficiently inserted and thus water droplets can be prevented from splashing onto the face or body of the user from the user's hand.

INDUSTRIAL APPLICABILITY

As described above, the hand drying apparatus according to the present invention is useful in that the detection accuracy of each of a plurality of capacitance-detection-type proximity sensors can be increased and is useful in that the hand detection accuracy can be increased when a hand detection sensor that detects a hand inserted into the hand insertion portion includes a plurality of capacitance-detection-type proximity sensors.

REFERENCE SIGNS LIST 1 capacitance-detection-type proximity sensor structure, 2 detection electrode, 3 control element, 4 printed board, 5 hand insertion portion, 5a front wall, 5b rear wall, 5c bottom wall, 6 control unit, 7 front-side capacitance-detection-type proximity sensor structure for hand detection, 8 rear-side capacitance-detection-type proximity sensor structure for hand detection, 9 capacitance-detection-type proximity sensor structure for detecting a switching operation, 10 hand dryer, 11 connector, 14 airflow path, 20 upper-side capacitance-detection-type proximity sensor structure for hand detection, 21 lower-side capacitance-detection-type proximity sensor structure for hand detection, 22 bottom-side capacitance-detection-type proximity sensor structure for hand detection, 30 airflow generating device, 32 nozzle, 34 operation unit, 100 housing.

The invention claimed is:

1. A hand drying apparatus that includes a capacitance-detection-type sensor that detects a capacitance generated in a capacitance detection electrode to detect a presence or absence of an object to be detected, the hand drying apparatus comprising
a plurality of the capacitance-detection-type sensors, wherein
while one of the capacitance-detection-type sensors is in operation, an operation of at least another of the capacitance-detection-type sensors is stopped.

2. The hand drying apparatus according to claim 1, wherein the capacitance-detection-type sensors are operated during different periods of time.

3. The hand drying apparatus according to claim 1, further comprising:
a housing that includes a hand insertion portion into which a user is able to insert a hand and an air outlet that communicates with the hand insertion portion;
a high-pressure airflow generating device that is disposed in the housing;
a hand detection sensor that detects an insertion of a user's hand into the hand insertion portion; and
a control unit that, when the hand detection sensor detects a user's hand, drives the high-pressure airflow generating device to cause an airflow to be ejected from the air outlet to the hand insertion portion, wherein
the capacitance-detection-type sensors are used as the hand detection sensor.

4. The hand drying apparatus according to claim 2, wherein a period of non-operation, during which an operation of all the capacitance-detection-type sensors is stopped, is provided from when an operation of any of the capacitance-detection-type sensors ends to when an operation of another of the capacitance-detection-type sensors is started.

5. The hand drying apparatus according to claim 3, wherein the hand detection sensor is formed by disposing the capacitance-detection-type sensors on a surface of surfaces that surround the hand insertion portion.

6. The hand drying apparatus according to claim 3, wherein the hand detection sensor is formed by disposing the capacitance-detection-type sensors on two or more surfaces of surfaces that surround the hand insertion portion.

7. The hand drying apparatus according to claim 3, further comprising an operation unit that is configured such that the capacitance-detection-type sensor is used for at least one of a power switch that switches a power supply on and off and an air-volume regulating switch that regulates a volume of airflow to be generated by the high-pressure airflow generating device, wherein
  an operation time of the capacitance-detection-type sensor that constitutes the operation unit overlaps with an operation time of at least one of the capacitance-detection-type sensors that constitute the hand detection sensor.

8. The hand drying apparatus according to claim 3, further comprising an operation unit that is configured such that the capacitance-detection-type sensor is used for at least one of a power switch that switches a power supply on and off and an air-volume regulating switch that regulates a volume of airflow to be generated by the high-pressure airflow generating device, wherein
  the capacitance-detection-type sensor that constitutes the operation unit and the capacitance-detection-type sensors that constitute the hand detection sensor are operated during different periods of time.

9. The hand drying apparatus according to claim 3, wherein a period of non-operation, during which an operation of all the capacitance-detection-type sensors is stopped, is provided from when an operation of any of the capacitance-detection-type sensors ends to when an operation of another of the capacitance-detection-type sensors is started.

* * * * *